US010300576B2

(12) United States Patent
Oseki et al.

(10) Patent No.: US 10,300,576 B2
(45) Date of Patent: May 28, 2019

(54) POLISHING METHOD

(71) Applicant: SHIN-ETSU HANDOTAI CO., LTD., Tokyo (JP)

(72) Inventors: Masaaki Oseki, Nishigo-mura (JP); Michito Sato, Nishigo-mura (JP); Kaoru Ishii, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/777,745

(22) PCT Filed: Nov. 29, 2016

(86) PCT No.: PCT/JP2016/004996
§ 371 (c)(1),
(2) Date: May 21, 2018

(87) PCT Pub. No.: WO2017/098696
PCT Pub. Date: Jun. 15, 2017

(65) Prior Publication Data
US 2018/0369984 A1 Dec. 27, 2018

(30) Foreign Application Priority Data
Dec. 10, 2015 (JP) .................... 2015-241203

(51) Int. Cl.
H01L 21/00 (2006.01)
B24B 37/015 (2012.01)
(Continued)

(52) U.S. Cl.
CPC ............ *B24B 37/015* (2013.01); *B24B 49/14* (2013.01); *H01L 21/304* (2013.01); *H01L 21/30625* (2013.01); *H01L 22/26* (2013.01)

(58) Field of Classification Search
CPC ............ H01L 21/02024; H01L 21/304; H01L 21/30625; H01L 22/26; B24B 37/015; B24B 49/14
(Continued)

(56) References Cited

U.S. PATENT DOCUMENTS 5,733,177 A 3/1998 Tsuchiya et al.
2013/0072091 A1* 3/2013 Schwandner ........... B24B 37/16
451/41

FOREIGN PATENT DOCUMENTS

JP H09-38849 A 2/1997
JP 2000-210860 A 8/2000
(Continued)

OTHER PUBLICATIONS

Jan. 24, 2017 International Search Report issued in International Patent Application No. PCT/JP2016/004996.

*Primary Examiner* — David S Blum
(74) *Attorney, Agent, or Firm* — Oliff PLC

(57) ABSTRACT

A polishing method including polishing to polish a surface of a wafer by sliding the wafer held by a polishing head on a surface of a polishing pad while supplying a polishing slurry to the polishing pad attached to a turntable, the method including correlation derivation to obtain a correlation between a surface temperature of the polishing pad and a haze level of a wafer polished with the use of the polishing pad in advance before performing the polishing, and also the wafer is polished in the polishing while controlling the surface temperature of the polishing pad based on the correlation between the surface temperature of the polishing pad and the haze level of the wafer polished with the use of the polishing pad. Consequently, the polishing method can control a haze in polishing a wafer and thereby prolong the service life of the polishing pad.

17 Claims, 3 Drawing Sheets

(51) Int. Cl.
　　　*B24B 49/14*　　　(2006.01)
　　　*H01L 21/304*　　(2006.01)
　　　*H01L 21/306*　　(2006.01)
　　　*H01L 21/66*　　　(2006.01)
(58) Field of Classification Search
　　　USPC .......................................................... 438/5
　　　See application file for complete search history.

(56)　　　　　　References Cited

FOREIGN PATENT DOCUMENTS

JP　　　　2003-86553　A　　3/2003
JP　　　　2003-159645　A　　6/2003

\* cited by examiner

POLISHING METHOD

TECHNICAL FIELD

The present invention relates to a polishing method.

BACKGROUND ART

In recent years, with advancement of miniaturization of semiconductor devices using silicon wafers or the like, a possibility has been pointed out that very fine particles of approximately 10 to 20 nm, which have not brought question conventionally, affect device performances.

To detect particles on a surface of each wafer, an inspection technique using scattered light is generally used. Since the particle detection sensitivity provided by a measuring machine using the scattered light is determined by a ratio of a defect signal and its background noise, when the background noise called haze is high, the S/N ratio is lowered, and accurate measurement cannot be performed. It is known that, since scattered light due to surface roughness of a wafer is detected by a haze, the haze has a close relationship with the surface roughness, and reducing the surface roughness decreases the haze.

A typical technique to suppress the haze includes controlling cleaning conditions which is performed after final polishing of wafers. For example, lowering the cleaning temperature of SC1, which is a mixed solution of $NH_3$ and $H_2O_2$, suppresses the alkaline etching function on a wafer surface, and reduces the surface roughness, consequently decreasing the haze.

CITATION LIST

Patent Literature

Patent Literature 1: Japanese Unexamined Patent Application Publication No. Hei 9-38849

DISCLOSURE OF INVENTION

Problems to be Solved by the Invention

However, in the above-described method for lowering the temperature of SC1, the cleaning power is also reduced, so that particles on a surface of each wafer cannot be sufficiently removed. Thus, there is a demand for haze reduction by a method other than the SC1-temperature adjustment.

It is known that a haze is affected by polishing conditions of final polishing and the like besides the cleaning conditions. Thus, conventionally, efforts have been made to avoid haze generation by, e.g., reducing relative speeds of a polishing pad and a wafer at the last stage of final polishing, as in Patent Literature 1, for example. However, this method still has a problem that a haze cannot be fully controlled, as compared with the method for reducing the haze by controlling the cleaning conditions.

Further, it is known that a haze is also affected by the use time of a polishing pad. Since the haze is degraded as the use time of a polishing pad increases, the polishing pad must be periodically replaced when the haze of a polished wafer exceeds a predetermined management value. When a haze level cannot be controlled sufficiently, the polishing pad must be replaced frequently, bringing about problems of a decrease in productivity and an increase in cost in manufacture of wafers.

The present invention has been made in view of such problems as described above, and it is an object of the present invention to provide a polishing method which can control a haze in polishing a wafer and can thereby prolong the service life of a polishing pad. Further, it is another object to perform control to suppress the haze in particular.

Means for Solving Problems

To achieve the objects, the present invention provides a polishing method including polishing to polish a surface of a wafer by sliding the wafer held by a polishing head on a surface of a polishing pad while supplying a polishing slurry to the polishing pad attached to a turntable, the method characterized by including correlation derivation to obtain a correlation between a surface temperature of the polishing pad and a haze level of a wafer polished with the use of the polishing pad in advance before performing the polishing, and also characterized in that the wafer is polished in the polishing while controlling the surface temperature of the polishing pad based on the correlation between the surface temperature of the polishing pad and the haze level of the wafer polished with the use of the polishing pad.

As described above, when the surface temperature of the polishing pad during polishing is controlled based on the correlation of the surface temperature of the polishing pad and the haze level obtained in advance, the haze level of the wafer can be controlled. In particular, when the surface temperature of the polishing pad is appropriately controlled based on the correlation, the haze level can be controlled to decrease. Furthermore, when the haze level of each polished wafer can be controlled to decrease in this manner, the polishing pad can be used for a long time, and hence the service life of the polishing pad can be prolonged.

In this event, it is preferable to perform the correlation derivation by carrying out test polishing on a plurality of test wafers with the use of polishing pads having different surface temperatures, measuring a haze level of each of the wafers after the test polishing, and thereby obtaining the correlation between the surface temperature of the polishing pad and the haze level of the wafer polished with the use of the polishing pad.

In this manner, the correlation between the surface temperature of the polishing pad and the haze level can be derived in advance.

Moreover, in the polishing, the surface temperature of the polishing pad can be controlled by adjusting at least one of a temperature of the polishing slurry supplied to the polishing pad, the number of revolutions of the polishing head, and the number of revolutions of the turntable.

When the polishing conditions are changed in this manner, the surface temperature of the polishing pad can be controlled.

Additionally, in the polishing, the surface temperature of the polishing pad can be controlled by heating the surface of the polishing pad with the use of a heater and/or cooling the surface of the polishing pad based on injection of cold air.

The surface temperature of the polishing pad can also be controlled in this manner.

In this event, it is preferable to obtain the correlation by further periodically performing the correlation derivation, and control the surface temperature of the polishing pad based on the periodically obtained correlation.

Since the correlation between the surface temperature of the polishing pad and the haze level changes depending on the use time of the polishing pad in some cases, when the correlation according to the use time of the polishing pad is periodically obtained as described above and the surface temperature of the polishing pad is controlled based thereon, wafers having desired haze levels can be assuredly provided for a long term. In particular, when the surface temperature of the polishing pad is controlled in this manner, the haze level can be further suppressed, too.

Further, in this event, the polishing is preferably final polishing after rough polishing.

Since the haze is apt to be affected by the final polishing in particular, applying the polishing method of the present invention to the final polishing assuredly provides wafers having desired haze levels.

Effect of the Invention

According to the polishing method of the present invention, the haze level of each wafer can be controlled to a desired value. In particular, when the surface temperature of the polishing pad is appropriately controlled based on the correlation during polishing, the haze level can be controlled to decrease. Furthermore, when the haze level of each polished wafer can be controlled to decrease in this manner, the polishing pad can be used for a long time, and hence the service life of the polishing pad can be prolonged.

BEST MODES FOR CARRYING OUT THE INVENTION

Although an embodiment of the present invention will now be described hereinafter, the present invention is not restricted thereto.

As described above, a conventional technology has a problem that a haze level cannot be controlled sufficiently by polishing. Further, since a polishing pad must be replaced when a predetermined management value is exceeded, if the haze level cannot be controlled sufficiently, the polishing pad must be frequently replaced, bringing about problems of a reduction in productivity and an increase in cost in manufacture of wafers.

Thus, to solve such problems, the present inventors have repeatedly conducted examinations as follows. First, since the temperature of a chemical liquid in cleaning has a great impact on haze, the present inventors have considered that the temperature of a polished surface of a wafer can be an important factor of the haze in polishing, too. However, since it is difficult to directly measure the temperature of a polished surface, attention has been paid to the surface temperature of a polishing pad which is considered to exhibit a value closest to the temperature of the polished surface, and the inventors have examined whether a haze level can be controlled by controlling the surface temperature of the polishing pad.

Figure 1:
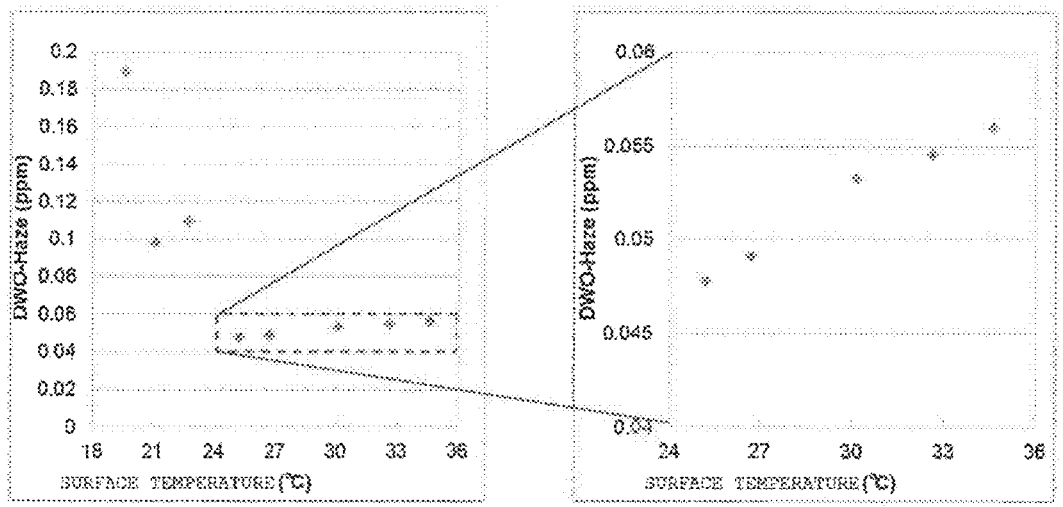
FIG. 1 shows graphs for illustrating an example of a correlation between a surface temperature of a polishing pad and a haze.

As a result of performing polishing at various surface temperatures of the polishing pad, it has been revealed that the haze level decreases as the surface temperature lowers as shown in FIG. 1, but the haze is precipitously degraded when the surface temperature falls below a given temperature. Consequently, it can be understood that there is a surface temperature of the polishing pad which provides the minimum haze.

Figure 2:
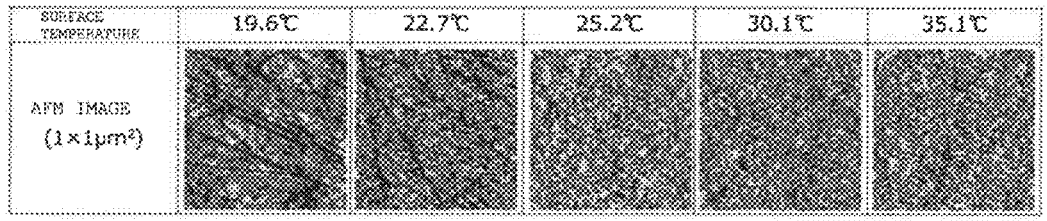
FIG. 2 shows photographs for illustrating surface observation results of a polished wafer provided by an atomic force microscope.

Thus, the surface structure of a wafer polished at each surface temperature was observed by an atomic force microscope (AFM). The AFM was used to observe an intermediate position between the center and an outer periphery of the wafer, and the observation range was set to $1 \times 1$ $\mu m^2$. Consequently, as shown in FIG. 2, at a surface temperature which provides a minimum value of the haze level or higher temperatures, no noticeable surface structure of the wafer was observed. On the other hand, at a surface temperature less than the surface temperature which provides the minimum value of the haze level, a fine scratch pattern (which will be referred to as nanoscratches hereinafter) was observed on the surface of the wafer.

Figure 3:
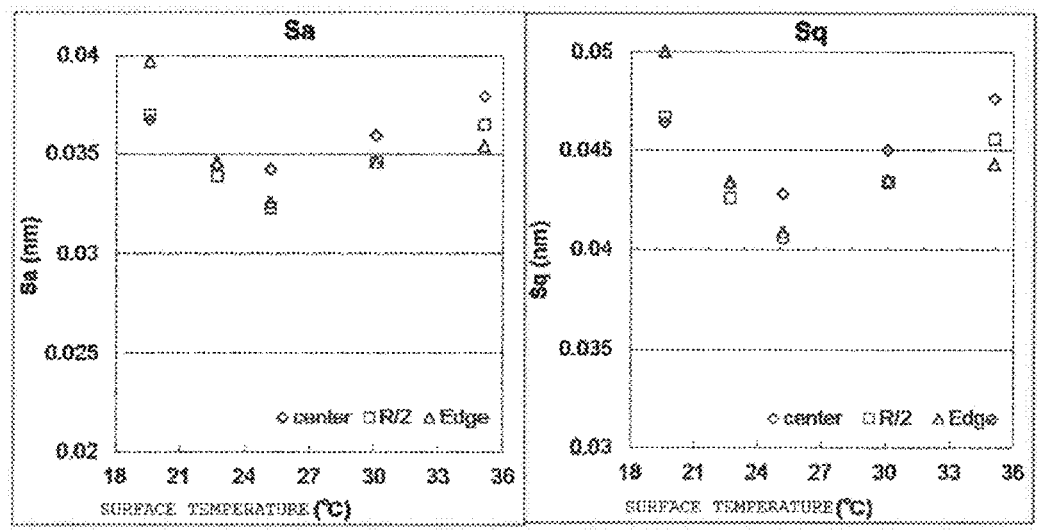
FIG. 3 shows graphs for illustrating arithmetic mean roughness (Sa) and root mean square roughness (Sq) calculated from atomic force microscopic images.

FIG. 3 shows arithmetic mean roughness (Sa) and root mean square roughness (Sq) calculated from the AFM images. In FIG. 3, Center means the center of the wafer, R/2 means an intermediate position between the center and the outer periphery, and Edge means data obtained from observation at a position which is 10 mm shifted toward the center from the outer periphery. Like the tendency of the haze, it has been revealed that there is a surface temperature of the polishing pad which provides a minimum value of roughness and this surface temperature is the same as the surface temperature which provides the minimum value of the haze.

A cause of the minimum values thus provided can be considered as follows. When a polishing temperature lowers, the etching rate of an alkali on silicon is suppressed, and hence excessive surface roughness is suppressed. However, it can be considered that, when the etching rate is excessively suppressed, the softening function of the alkali on the silicon surface is also lost, resulting in such a polishing mode that damage by abrasive grains appears on the surface as the nanoscratches like mechanical polishing.

Thus, the inventors have acknowledged that controlling the surface temperature of the polishing pad based on, for example, a correlation between the surface temperature of the polishing pad and the haze level as shown in FIG. 1 as a technique to control the haze enables controlling of the haze level by polishing, thereby bringing the present invention to completion.

A polishing method according to the present invention will now be described hereinafter in detail. As shown in a flowchart of FIG. 4, the polishing method according to the present invention includes: correlation derivation to obtain a correlation between a surface temperature of a polishing pad and a haze level of a wafer polished by using the polishing pad; and polishing to polish a surface of a wafer.

First, in the polishing method according to the present invention, the correlation derivation is carried out before the polishing is performed as described above. In the correlation derivation, for example, a correlation between a surface temperature of a polishing pad and a haze level of a wafer polished by using the polishing pad as shown in FIG. 1 is obtained.

In the present invention, this correlation can be obtained by carrying out test polishing on a plurality of test wafers with the use of polishing pads having different surface temperatures and measuring haze levels of the respective wafers after the test polishing. In the test polishing, each test wafer may be polished with the same polishing pad whose surface temperature changes by, for example, adjusting the polishing conditions.

After the correlation is obtained in this manner, the polishing (main polishing) is performed. Here, a polishing apparatus which can be used in the polishing (main polishing) and the test polishing will now be described with reference to FIG. 5. A polishing apparatus 1 can be mainly constituted of a polishing head 2 which holds a wafer W, a turntable 3 to which a polishing pad 4 is attached, a polishing slurry supply mechanism 5, and so forth. Further, each of the polishing head 2 and the turntable 3 can rotate. Furthermore, since it is preferable to constantly cover a surface of the polishing pad 4 with a polishing slurry while polishing is being performed, the polishing slurry is desirably continuously supplied by providing a pump or the like to the polishing slurry supply mechanism 5. Moreover, as the polishing slurry supply mechanism 5, it is possible to use one having a function to adjust the temperature of the polishing slurry to be supplied to the polishing pad 4.

In such a polishing apparatus 1, a surface of the wafer W is polishing by sliding the wafer W held by the polishing head 2 on the surface of the polishing pad 4 while supplying the polishing slurry to the polishing pad 4 attached to the turntable 3.

Such a polishing apparatus as described above is used to polish the wafer while controlling the surface temperature of the polishing pad based on the correlation between the surface temperature of the polishing pad and the haze level of the wafer polished with the use of the polishing pad.

According to such a polishing method of the present invention, when the surface temperature of the polishing pad is controlled based on the correlation obtained in advance, the haze level of the polished wafer can be controlled to a desired value. In particular, when the haze level is desirably further suppressed, the polishing should be performed while controlling the surface temperature so low that no nanoscratch is produced. For example, when such a correlation as shown in FIG. 1 is obtained, to control the haze level to decrease as much as possible, the surface temperature of the polishing pad should be controlled to a temperature as low as 25° C. but does not fall below 22.7° C. at which nanoscratches are produced on the polished wafer and the haze level begins to degrade.

Additionally, when the polishing is performed while controlling the surface temperature of the polishing pad to reduce the haze level, a time taken for the haze level to exceed a management value can be prolonged as compared with conventional examples, so that the service life of the polishing pad can be extended. Consequently, it is possible to suppress a decrease in productivity and an increase in cost in manufacture of wafers.

Further, in the present invention, the surface temperature of the polishing pad can be controlled by adjusting at least one of a temperature of the polishing slurry supplied to the polishing pad, the number of revolutions of the polishing head, and the number of revolutions of the turntable.

Further, the surface temperature of the polishing pad may be controlled by heating the surface of the polishing pad with the use of a heater, cooling the surface of the polishing pad based on injection of cold air, or by performing both the heating and the cooling. In this case, for example, as the polishing apparatus 1 in FIG. 5, one having a surface temperature control mechanism 6 such as a heater and a cooling means can be used.

Furthermore, in the present invention, it is preferable to obtain the correlation between the surface temperature and the haze level by periodically performing the correlation derivation which is carried out before the polishing, and to control the surface temperature of the polishing pad based on the periodically obtained correlation. Since the surface state of the polishing pad can change depending on the use time of the polishing pad, the correlation also changes depending on the use time of the polishing pad in some cases. Thus, periodically obtaining the correlation is preferable. Moreover, when polishing conditions are periodically readjusted based on the correlation between the surface temperature and the haze level with the use time of the polishing pad taken into consideration so that the surface temperature can be controlled to be an optimum surface temperature at that moment, it is possible to perform control to provide the surface temperature at which a desired haze level can be assuredly obtained. Consequently, the excellent haze level can be maintained for a longer time, and the service life of the polishing pad can be prolonged. The frequency of the readjustment of the polishing conditions is not restricted in particular, but it can be set to approximately 1000 polishing batches.

In particular, when the correlation between the surface temperature and the haze level according to the use time of the polishing pad is obtained in advance, it is also possible to obtain a surface temperature at which nanoscratches are produced after a certain use time of the polishing pad. Thus, when the haze level is desirably suppressed as much as possible, the surface temperature can be controlled to such a low temperature that nanoscratches are not produced after a certain use time of the polishing pad.

Additionally, it is preferable to apply such a polishing method of the present invention as described above to final polishing. That is, the polishing in the present invention is preferably final polishing after rough polishing. Since the haze is apt to be affected by the final polishing in particular, applying the polishing method of the present invention to the final polishing assuredly provides wafers having desired haze levels.

EXAMPLES

The present invention will now be more specifically described hereinafter with reference to examples and comparative examples of the present invention, but the present invention is not restricted to the examples.

Example 1

Figure 4:
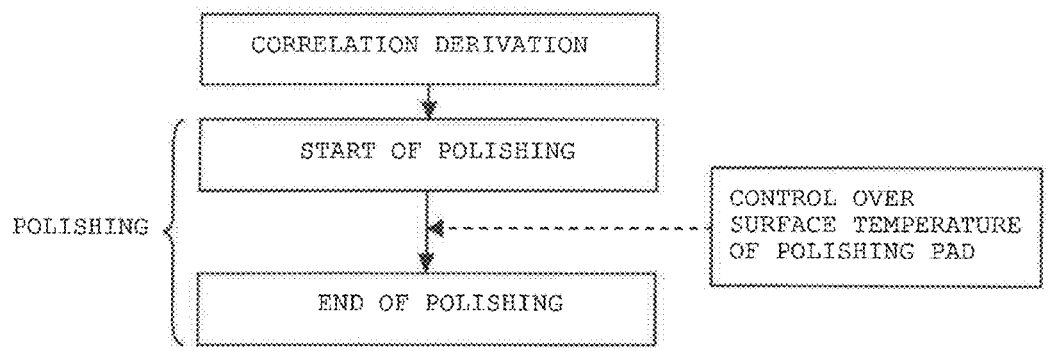
FIG. 4 is a flowchart showing an example of a polishing method according to the present invention.

The final polishing was performed in accordance with the polishing method of the present invention as shown in FIG. 4. As a wafer which is a polishing target, a silicon wafer with a diameter of 300 mm subjected to rough polishing was used.

Figure 5:
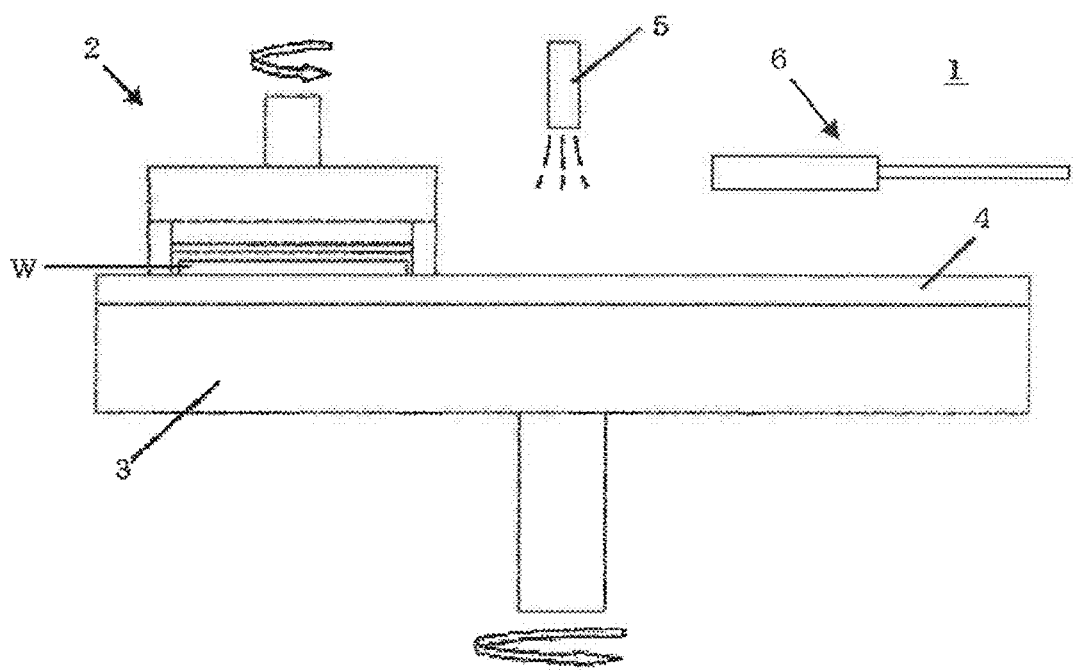
FIG. 5 is a schematic view showing an example of a polishing apparatus which can be used in the polishing method according to the present invention.

Further, polishing conditions were as follows. First, as a polishing apparatus, the polishing apparatus as shown in FIG. 5 was used. A suede pad was used as a polishing pad, and a mixture obtained by adding ammonia and a water-soluble high-molecular polymer to colloidal silica was used as a polishing slurry. The number of wafers to be polished in one batch was two, and the number of revolutions of each of a turntable and a polishing head was 30 rpm.

Further, in the example, before the main polishing (the polishing), the correlation derivation was performed as follows. First, a plurality of test wafers which are the same as the silicon wafer polished in the main polishing and a polishing pad which is the same as that in the main polishing were used. The supply temperature of the polishing slurry was controlled such that the surface temperature of the polishing pad changed at intervals of 2° C., and the test wafers were polished at each of the surface temperatures (test polishing). Furthermore, a correlation between the surface temperatures of the polishing pad and haze levels of the silicon wafers polished with the use of the polishing pad was obtained from the result of this test polishing. The surface temperatures of the polishing pad were measured by using a noncontact temperature sensor. Moreover, the haze levels were measured in a DWO mode by using Surfscan SP3 manufactured by KLA Tencor Corporation. The correlation in FIG. 1 was obtained in this manner.

Then, the main polishing was performed while controlling the surface temperature of the polishing pad to 24.7° C. to minimize the haze level by adjusting a temperature of the polishing slurry based on the correlation.

Comparative Example 1

The polishing was performed in the same manner as Example 1 except that the surface temperature of the polishing pad was not controlled based on the correlation between the surface temperatures of the polishing pad and the haze levels of the silicon wafers polished by using the polishing pad.

The haze levels and a sum of defects (SOD) of the silicon wafers polished in Example 1 and Comparative Example 1 were measured by using Surfscan SP3 manufactured of KLA Tencor Corporation, and the average values were calculated.

Table 1 shows the summary of implementation results in Example 1 and Comparative Example 1.

TABLE 1

|  | Example 1 | Comparative Example 1 |
| --- | --- | --- |
| Sum of defects (number) | 85 | 87 |
| DWO-HAZE (ppm) | 0.0491 | 0.0545 |

As can be understood from Table 1, it was revealed that the haze level in Example 1 was better than that in Comparative Example 1. Additionally, Example 1 and Comparative Example 1 have the equivalent sums of defects of the polished silicon wafers in this case. It can be understood from this result that the control was possible to improve the haze level without degrading the sum of defects in Example 1.

Example 2

A silicon wafer was polished by using the polishing method of the present invention like Example 1. Further, in Example 2, a correlation was obtained at each time point where a relative value of the use time of a polishing pad to the service life of the polishing pad in Comparative Example 2 described later (it is to be noted that the service life in Comparative Example 2 was set to 100) was 9, 25, 100, or 200. The slurry temperature of a polishing agent was readjusted to provide a surface temperature at which a haze was minimized. As adjustment conditions, the surface temperature of the polishing pad was set to 24.7° C. at the beginning, 23.3° C. when the relative value was 9 or more, 22.1° when the relative value was 25 or more, 21.1° C. when the relative value was 100 or more, and 20.5° C. when the relative value was 200 or more.

Further, the haze levels of the wafers at the respective time points where the slurry temperature of the polishing agent was readjusted were measured. Furthermore, in Example 2 and Comparative Example 2 described later, the upper limit of a management value of the haze levels was set to 0.0653 (ppm), and when a measured haze level had reached substantially the same as this value, the polishing was terminated and the polishing pad was replaced.

Comparative Example 2

Polishing was performed under the same conditions as those in Example 2 except that the surface temperature was not controlled based on the correlation between the surface temperatures of the polishing pad and the haze levels of the wafers polished by using the polishing pad. It is to be noted that the polishing conditions at the beginning of the polishing were the same as those in Example 2.

Moreover, the haze level of the wafer was measured at each time point when the relative value to the service life of the polishing pad in Comparative Example 2 was 9, 25, or 100 (service life) by the same method as that in Example 2.

Figure 6:
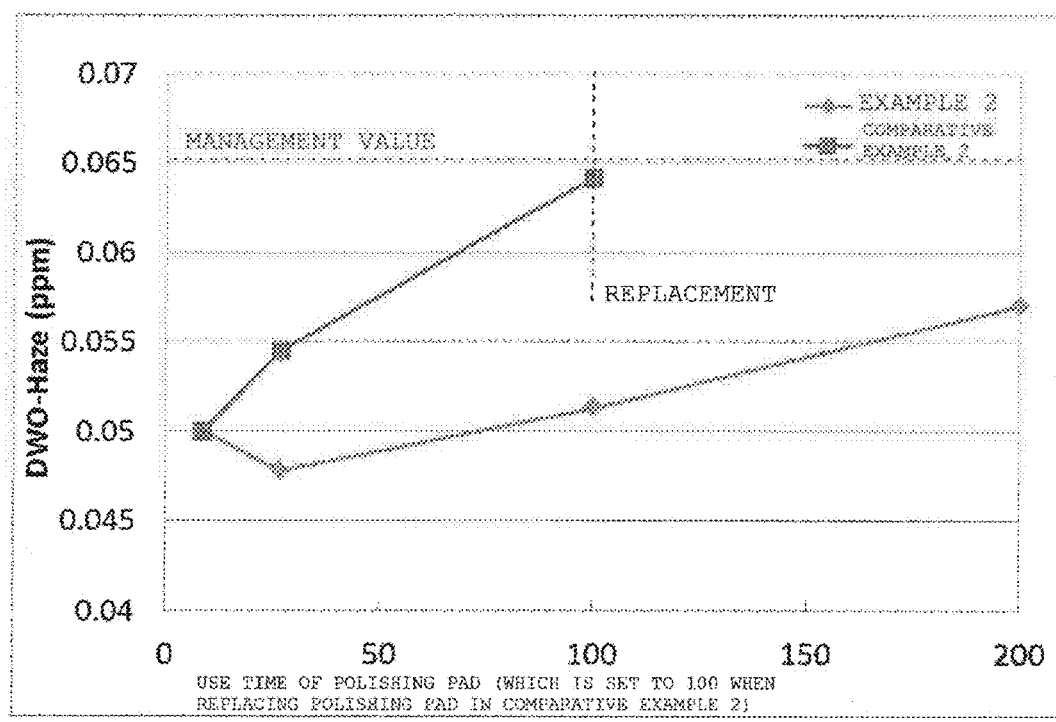
FIG. 6 is a graph for illustrating a relationship between a haze level and a use time of a polishing pad in each of Example 2 and Comparative Example 2.

FIG. 6 shows a relationship between the haze level and the use time of the polishing pad in each of Example 2 and Comparative Example 2. It is to be noted that, regarding Example 2, FIG. 6 shows the haze level until the polishing time reached the relative value of 200. As can be understood from FIG. 6 that, in Example 2 where the temperature of the polishing slurry was readjusted based on the correlation between the surface temperature and the haze level with the use time of the polishing pad taken into consideration, the degradation of the haze is moderate as compared with Comparative Example 2, and the haze level did not reach the upper limit of the management value even though the polishing pad was used for a time twice as long as the service life of the polishing pad in Comparative Example 2.

On the other hand, in Comparative Example 2, the haze was considerably degraded toward the last stage as compared with the initial polishing stage of the polishing pad, and the haze reached a value close to the upper limit of the management value in a considerably shorter time than that in Example 2. As described above, the degradation of the haze and the reduction in the service life of the polishing pad were confirmed when the surface temperature was not controlled based on the correlation between the surface temperature of the polishing pad and the haze level of the wafer polished with the use of the polishing pad.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. A polishing method comprising polishing to polish a surface of a wafer by sliding the wafer held by a polishing head on a surface of a polishing pad while supplying a polishing slurry to the polishing pad attached to a turntable,
wherein the method comprises correlation derivation to obtain a correlation between a surface temperature of the polishing pad and a haze level of a wafer polished with the use of the polishing pad in advance before performing the polishing, and the wafer is polished in the polishing while controlling the surface temperature of the polishing pad based on the correlation between the surface temperature of the polishing pad and the haze level of the wafer polished with the use of the polishing pad.

2. The polishing method according to claim 1, wherein the correlation derivation is performed by carrying out test polishing on a plurality of test wafers with the use of polishing pads having different surface temperatures, measuring a haze level of each of the wafers after the test polishing, and thereby obtaining the correlation between the surface temperature of the polishing pad and the haze level of the wafer polished with the use of the polishing pad.

3. The polishing method according to claim 1, wherein, in the polishing, the surface temperature of the polishing pad is controlled by adjusting at least one of a temperature of the polishing slurry supplied to the polishing pad, the number of revolutions of the polishing head, and the number of revolutions of the turntable.

4. The polishing method according to claim 2, wherein, in the polishing, the surface temperature of the polishing pad is controlled by adjusting at least one of a temperature of the polishing slurry supplied to the polishing pad, the number of revolutions of the polishing head, and the number of revolutions of the turntable.

5. The polishing method according to claim 1, wherein, in the polishing, the surface temperature of the polishing pad is controlled by heating the surface of the polishing pad with the use of a heater and/or cooling the surface of the polishing pad based on injection of cold air.

6. The polishing method according to claim 2, wherein, in the polishing, the surface temperature of the polishing pad is controlled by heating the surface of the polishing pad with the use of a heater and/or cooling the surface of the polishing pad based on injection of cold air.

7. The polishing method according to claim 3, wherein, in the polishing, the surface temperature of the polishing pad is controlled by heating the surface of the polishing pad with the use of a heater and/or cooling the surface of the polishing pad based on injection of cold air.

8. The polishing method according to claim 4, wherein, in the polishing, the surface temperature of the polishing pad is controlled by heating the surface of the polishing pad with the use of a heater and/or cooling the surface of the polishing pad based on injection of cold air.

9. The polishing method according to claim 1, wherein the correlation is obtained by periodically performing the correlation derivation, and the surface temperature of the polishing pad is controlled based on the periodically obtained correlation.

10. The polishing method according to claim 2, wherein the correlation is obtained by periodically performing the correlation derivation, and the surface temperature of the polishing pad is controlled based on the periodically obtained correlation.

11. The polishing method according to claim 3, wherein the correlation is obtained by periodically performing the correlation derivation, and the surface temperature of the polishing pad is controlled based on the periodically obtained correlation.

12. The polishing method according to claim 5, wherein the correlation is obtained by periodically performing the correlation derivation, and the surface temperature of the polishing pad is controlled based on the periodically obtained correlation.

13. The polishing method according to claim 1, wherein the polishing is final polishing after rough polishing.

14. The polishing method according to claim 2, wherein the polishing is final polishing after rough polishing.

15. The polishing method according to claim 3, wherein the polishing is final polishing after rough polishing.

16. The polishing method according to claim 5, wherein the polishing is final polishing after rough polishing.

17. The polishing method according to claim 9, wherein the polishing is final polishing after rough polishing.

* * * * *